United States Patent [19]

Karner et al.

[11] Patent Number: 5,554,255

[45] Date of Patent: Sep. 10, 1996

[54] METHOD OF AND APPARATUS FOR A DIRECT VOLTAGE ARC DISCHARGE ENHANCED REACTIVE TREATMENT OF OBJECTS

[75] Inventors: Johann Karner, Feldkirch, Austria; Erich Bergmann, Mels, Switzerland

[73] Assignee: Balzers Aktiengesellschaft, Furstentum, Liechtenstein

[21] Appl. No.: 222,378

[22] Filed: Apr. 4, 1994

Related U.S. Application Data

[62] Division of Ser. No. 757,712, Sep. 11, 1991, Pat. No. 5,336,326.

[30] Foreign Application Priority Data

Sep. 14, 1990 [DE] Germany .................. 40 29 268.1

[51] Int. Cl.$^6$ .................. B44C 1/22; C23C 16/00
[52] U.S. Cl. .................. 156/643.1; 118/723 E; 118/723 E; 427/569; 216/63; 216/67; 216/71
[58] Field of Search .................. 118/723 FE, 723 E, 118/723 ER, 723 HC, 715, 719, 663, 666; 156/345, 643.1; 204/192.38, 298.41; 427/569; 216/63, 67, 71

[56] References Cited

U.S. PATENT DOCUMENTS 4,749,587  6/1988  Bergmann et al. .

FOREIGN PATENT DOCUMENTS 58-93241  6/1983  Japan .
3-207859  9/1991  Japan .

OTHER PUBLICATIONS

UK Patent Application 2178228A, Schmid, Feb. 1987.

*Primary Examiner*—R. Bruce Breneman
*Assistant Examiner*—Toni Y. Chang
*Attorney, Agent, or Firm*—Louis Weinstein

[57] ABSTRACT

A method and apparatus for a reactive treatment of the surface of a workpiece, in which a process gas is brought into a chamber and a direct voltage arc discharge is generated in the chamber, the arc discharge is assisted or maintained, respectively by a coupling in of a flow of charged particles. In known treatment methods plasma generated in the direct voltage arc are generally distributed inhomogeneously in the inner space of the chamber and the area with a density of the plasma which is sufficient for the reactive surface treatment is relatively small. According to the invention this problem is solved in that the distribution of the effect of the treatment of the plasma in the chamber at least along a predetermined plane is set, and specifically by a setting of an areal distribution of the process gas inlet and/or setting of an areal distribution of the arc discharges in the chamber, in that the flow of charged particles is coupled into the chamber via a plurality of distribution openings. By such means, spatially large plasmas having high densities of ionization and acceptable densities of energy can be realized, such that it is possible to perform on the one hand treatment of large surface areas and on the other hand also treatment processes on objects which are thermally sensitive.

19 Claims, 5 Drawing Sheets

METHOD OF AND APPARATUS FOR A DIRECT VOLTAGE ARC DISCHARGE ENHANCED REACTIVE TREATMENT OF OBJECTS

This is a division of application Ser. No. 07/757,712, filed Sep. 11, 1991, now U.S. Pat. No. 5,336,326.

BACKGROUND OF THE INVENTION

1. Field of the Invention

The present invention refers to a method of a direct voltage arc discharge enhanced treatment of at least portions of the surface of an object where a gas or gas mixture, respectively hereinbelow termed process gas which is adapted to react at least partly is fed into an evacuated main chamber with the object to be treated and gaseous reaction products are drawn off from the chamber and a direct voltage arc discharge is maintained in the chamber whereby a flow of charged particles is coupled thereinto.

It also refers to a vacuum treatment arrangement with a vacuum chamber, an inlet arrangement opening thereinto for a process gas introduced at least in part to react in the main chamber, a draw-off arrangement for gaseous reaction products, an opening arrangement for introducing a flow of electrically charged particles into the main chamber, and an electrode arrangement for the generation of a direct voltage arc discharge in the chamber.

2. Description of the Prior Art

A method of the kind mentioned above and an arrangement are disclosed in Swiss Specification CH-A-664,768. In addition, U.S. Pat. No. 4,851,254 discloses a method for a reactive plasma enhanced coating of objects, in which a direct voltage arc discharge is maintained in a vacuum chamber between two closely spaced electrodes, which arc discharge operates at a low voltage below 100 V and relatively high arc currents in the range between 50 A and 100 A.

The object to be coated is placed outside of the cathode/anode space in an insulated manner and parallel to the arc discharge. A process gas which reacts at least partly is jetted to the plasma through a pipe conduit located opposite the object to be treated with respect to the anode/cathode space.

In plasma chemical methods the reaction space is substantially limited to a region surrounding the plasma zone of which the extent is of the magnitude of the length of the free path of the gas. The latter value is in turn proportional to the inverse value of the pressure. A lowering of the pressure in order to increase the size of the reaction space is, however, generally not possible, because the concentration of the reactant gases obviously also decreases when the pressure is lowered.

Therefore, this procedure is insofar deficient in that only small surfaces of the object can be coated, due to the small surface area which is adjacent the short anode/cathode space, and due to the point-like size of the jetting-in of the reactive process gas.

A further procedure of a reactive, plasma enhanced coating (PECO) is disclosed in U.S. Pat. No. 4,859,490. The apparatus disclosed therein includes a freely accessible glowing cathode coil, a screen connected relative thereto and maintained at a positive, anodic potential, and an electrode located opposite the screen relative to the glowing cathode and connected cathodically relative to the screen onto which the object to be treated is placed.

Gas, which is predominantly brought to react in the plasma generated between the glowing coil and the screen is jetted centrally into the main chamber and against the glowing coil. The drawback of this procedure is that the reactive gas must first flow through the glowing coil and thus reacts with the glowing coil. The effect thereof is that on the one hand the coating process of the commodity may be disturbed by the coil and on the other hand the useful operating life of the glowing coil is drastically reduced.

An example of such a condition shall be the depositing of diamond coatings from hydrocarbon/hydrogen mixtures. The carburetion of the filaments of refraction metal proceeds thereby for such arrangements at such a high speed that they fail due to breaking after one to three coating cycles. From the viewpoint of a controlled industrial production this is unacceptable. Similar problems are encountered in other gases in form of a scaling or forming of hydrides or silicides.

The drawbacks of the method and apparatus disclosed in U.S. Pat. Nos. 4,851,254 and 4,859,490 are overcome by the procedure according to Swiss Patent No. CH-A-664,768 mentioned above, in that it is known from this document to generate a low voltage direct voltage (d.c.) arc discharge between an anode and a cathode in that electrically charged particles, electrons and ions, are fed into the discharge space by means of which it becomes possible to maintain between anodes and cathodes an arc at low arc voltages, which electrodes are located at a quite larger distance from each other than according to U.S. Pat. No. 4,851,254.

Due to the fact that also in contrast U.S. Pat. No. 4,859,490, for example, the thermally emitted electrons are not generated in the main chamber but rather outside of the main chamber and are coupled into the main chamber through an opening arrangement thereinto, the contamination of the treatment by the material of the hot coil or the reduction of the useful operating life thereof, respectively by the treatment process is also remedied.

The drawback of the procedure according to Swiss Specification CH-A-664,768 is now on the one hand that in the edge area of the treatment chamber a linear jetting-out of process gas with gas which is to be brought to react is made, or that an inhomogeneous discharge or distribution of plasma, occurs in the inner space of the main chamber seen over its volume.

In many methods this is disturbing to such an extent that it prevents the practicing thereof. Every plasma-chemical reaction necessitates a certain plasma density, i.e. a minimal space density of charge carrying particles where it should proceed.

At the arrangement according to Swiss Specification CH-A-664,768 the space density decreases rapidly in the radial direction. An increase of the arc power does not always solve this problem. The heating up of the substrates in the arc plasma is supplied predominantly by convection. The radial extent thereof is unrestricted. An increase of the power causes a substantially larger increase of the thermal loading on the substrates than of the plasma density which is needed for the depositing.

SUMMARY OF THE INVENTION

It is a general object of the invention to eliminate the above-mentioned drawbacks which occur when using the last-described advantageous method for generation of an arc.

This object is achieved by use of a method of a direct voltage arc discharge assisted reactive treatment as mentioned above in which the distribution of the effect of the treatment at least along a predetermined area in the reaction space is at least partly determined by selecting an areal distribution of the process gas inlet and/or in which the distribution of the effect of the treatment at least along a predetermined area in the reaction space is at least partly set by selecting an at least two dimensional distribution of arc discharges in the main chamber.

A further object is to provide a vacuum treatment arrangement as mentioned above in which the inlet arrangement for the process gas includes a plurality of areally distributed inlet openings and/or in which the opening arrangement for the flow of charged particles includes a plurality of distribution openings into the inner space of the main chamber for the generation of an at least two-dimensionally distributed arc discharge.

Preferred embodiments of the inventive methods and apparatus are set forth in the appended claims.

It must specifically be noted that by generating a spatially distributed low voltage arc discharge externally of the main chamber generated electrically charged particles and their coupling into the anode/cathode space of the main chamber it is possible to realize spatially spread plasmas of a high density of ions and an acceptable density of the energy, such as, for example, at arc voltages <150 V arcs over spaces or gaps larger than 30 cm. This is accomplished at current densities of several 100 A per $m^2$ up to more than several kA per $m^2$ at the anode/cathode surfaces. Thereby temperatures are realized in the plasma of less than 900° C., such as of 800° C. and less, which, specifically also combined with a distributed inlet of process gas into the treatment chamber, allows the treatment of large surface areas of objects or of a plurality of objects. Due to the relatively low temperatures and the high density of energy, it is possible to treat objects which are critical as concerns thermal loading, which processes were hardly possible up to now or only with the use of excessive cooling.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENTS

Figure 1:
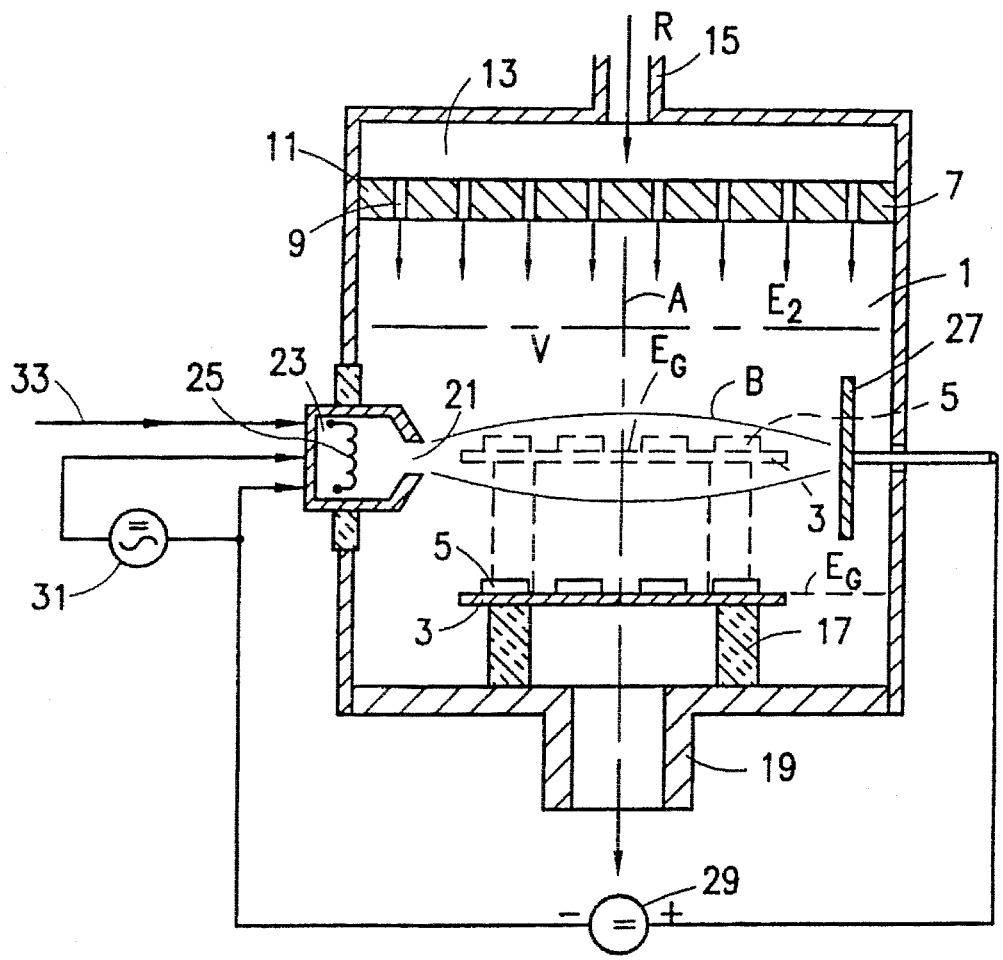
FIG. 1 illustrates schematically a first variant of an embodiment of the inventive arrangement and based thereupon, respectively a first variant of the inventive method.

FIG. 1 illustrates schematically a first variant of an embodiment of an inventive treatment chamber for the explanation of a first variant of an embodiment of the inventive procedure.

The object 5 to be treated, in the form of one or of as illustrated herein a plurality of workpieces is positioned on a support 3 in a vacuum treatment chamber. The support 3 defines for the object to be treated a supporting surface, here a supporting plane $E_G$. Opposite support 3 and thus plane $E_G$ an inlet arrangement 7 for a process gas or process gas mixture R with reaction gas or reaction gas mixture, respectively is foreseen at the chamber 1.

The inlet arrangement 7 includes a two-dimensionally or areally respectively distributed arrangement of inlet openings in a plate 11 which are supplied from a pressure equalizing chamber 13 which, facing away from the reaction space V of the chamber 1 relative to plate 11 is in turn supplied through one or more gas supply lines 15.

The support 3 is designed in the illustrated embodiment in a table-like manner and is supported by insulation means 17 at the wall of chamber 1. A draw-off line 19 located below support 3 is provided for evacuating chamber 1 and also, during the treatment process, for drawing off gaseous reaction products or consumed process gas, respectively.

A hot cathode chamber 23 communicates through an orifice opening 21 with the reaction space V of the chamber 1, and a directly or indirectly heated hot cathode 25 is located in chamber 23. An anode 27 is arranged in chamber 1 opposite the orifice opening 21.

As is illustrated schematically, d.c. voltage for maintaining arc discharge is applied by means of a direct voltage generator 29 coupled across hot cathode 25 and anode 27. Electrical heating of the hot cathode 25 is obtained by means of a generator 31. Generator 31 can be a direct (d.c.) or alternating (a.c.) current generator, and may include an isolating transformer for connecting its output to coil 25.

In principle any structural form is suitable for the cathode of the arc discharge as long as it is suitable to supply a sufficiently high current at stable operating conditions. Specifically the ionization chamber 23 can be replaced by a hollow cathode.

In a different embodiment the ionization chamber is designed as a spark chamber. This is schematically illustrated in FIG. 1b. Details of the design of such a structure are known from the vapor deposition techniques where it is already in practical use, for instance as disclosed in German Specification DE-OS 34 13 701 which reference for reasons of the disclosure is herewith specifically made part of the present description by reference thereto. FIG. 1b illustrates schematically such a spark chamber with a water cooled cathode 26, insulation 28, orifice 30 and chamber wall 32. The anode is located in the chamber.

The orifice 30 or 21, respectively which separates the cathode chamber and also the spark chamber from the depositing space P must be designed in such a manner that at the one side no metal vapor exits out of the cathode chamber into the depositing or coating chamber, and at the other side that the electrons find their way to (i.e. are directed to) the anode in the coating chamber.

The volume of the pressure equalizing chamber 13 is of such a size that a uniform distribution of the gas supplied through the line 15 relative to the inlet openings 9 therein is arrived at, and by distribution of the inlet openings, their flow cross-sections and their axial lengths, thus via their flow resistances and the direction of their outflow, a desired, substantially directed distribution of the inflow of the gas into the chamber 1 is produced.

In the illustrated example a substantially uniform gas outflow directed towards the support 3 is reached by an equal distribution and uniform design of the openings 9 along the plate 11. The process gas led into the reaction space V reacts therein and divides partly to a portion which increases over time and at least partly to used or consumed process gas which is drawn off through the line 19.

Due to the distributed process gas inlet arrangement 7 and the drawing-off line 19 located substantially centrally relative to this inlet arrangement 7, respective substantially the same ratios of not consumed process gas to consumed process gas are achieved in the reaction space V along the dot-dash line which represents plane(s) $E_2$. Because the object to be treated is positioned by the support 3 on such a plane, a uniform distribution of the treatment effect at least onto surface areas of the objects which are equidistant to this plane is realized.

Due to the said direction and design of the inlet openings 9 and together with the arrangement of the drawing-off line 19, the shape of the said equi-distribution surfaces $E_2$ is substantially determined, which surfaces or areas $E_2$ in the illustrated example are planes extending parallel to each other. Because an arc discharge B is maintained in the here illustrated example in a small volume area only, its effect is not the same in the entire reaction space V.

There are coating applications where this non-uniform distribution of plasma of the arc discharge B can be compensated by an aimed non-uniform gas inlet or where it is of no importance because the treating process is operated with a large excess of reaction gas. In such a case it is only necessary to balance or equalize, respectively the non-uniform distribution of the coating which for instance in case of small objects is made by means of a rotating basket with planetary spindles whereon the objects are supported.

The chamber 1 is preferably at least internally made at all surfaces of a material which does not negatively influence the treatment process, such as stainless steel. In specific cases at least predominant parts of chamber 1 can consist of quartz glass or a ceramic material.

The support 3 and thus the objects being treated are preferably and according to one variant not connected to a selected electric potential but, such as realized by the insulating supports 17, are operated at a floating potential. Thus, an electrical floating potential can be established thereon in accordance with the distribution of the electric potential in the reaction space V. By means of this arrangement the treatment temperature of the objects is lowered, in contrast to the case where the objects would be held at anodic potential, as at anode potential.

In this fashion a controlled treatment of a large surface area of an object is already possible by a reactive arc plasma enhanced method. The arc discharge generated in accordance with the described procedure is a long low-voltage discharge which is maintained at pressures of only a few $P_a$ with a low d.c. voltage, for example, below 150 V, usually at voltages on the order of the ionization energy of the process gas mixture.

In order to prevent gases brought into the reaction space from contacting the hot electrode 25 of which the material then could influence the treatment process and would also react, wherewith the lifespan of electrode 25 would be drastically reduced, a scavenging gas is preferably fed into the cathode chamber 23, for example, through a conduit 33. The pressure in the cathode chamber 23 can thereby be set somewhat higher than the process pressure in the reaction space V so that a gas flow out of the chamber is obtained.

An important matter during operation of low voltage discharges by hot cathodes is that an electrically neutral plasma flow exits from the ionization chamber into the coating chamber, and thus an equal number of ions and of electrons. In any case, a process compatible gas is introduced as scavenging gas, usually a noble gas.

By means of the low voltage arc generated accordingly a plasma with a relatively low gas temperature—at a high electron temperature, said temperature being on the order of 200° C. to 1000° C. This allows placing of the object (or objects) between the cathode and the anode which, as illustrated by broken lines is extremely advantageous for treatment processes which call for a high plasma density at low object temperatures.

Figure 1A:
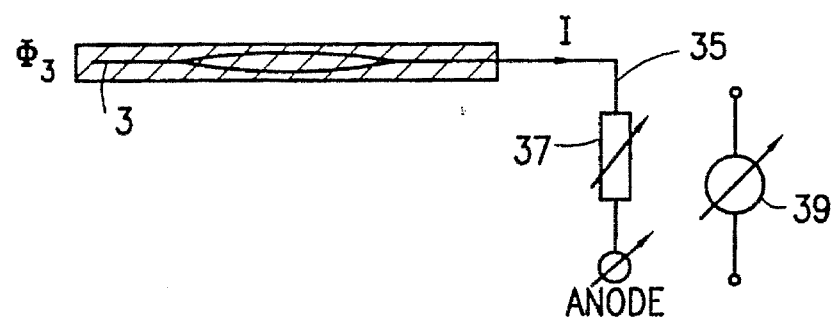
FIG. 1a illustrates an inventive temperature control method for adjusting temperature according to adjustment of the temperature of a support for the object to be treated such as foreseen in FIG. 1.
Figure 1B:
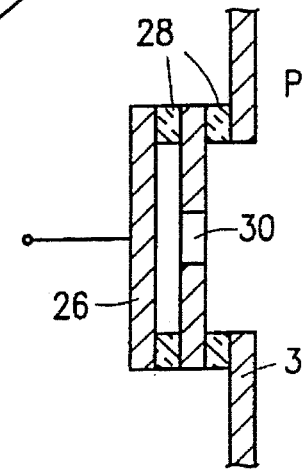
FIG. 1b illustrates schematically a sectionalized portion of the arrangement according to FIG. 1 employing an alternatively employed spark chamber.

FIG. 1a schematically illustrates a part of the support 3 of FIG. 1. It already has been mentioned that due to the electrically floating potential mounting of the support 3 an electrical potential $\Phi_3$ corresponding to the distribution of the electrical potential in the reaction space V establishes thereat. Now, according to a further embodiment of the arrangement illustrated in FIG. 1 the support 3 is preferably connected via a current branch 35, over a resistance element 37 to a reference potential, for example, anode potential. Therewith, a potential difference depending upon the impedance conditions in the reaction chamber V and the value of the resistance element 37 establishes via the latter, and the current I driven therethrough is used as a temperature control entity for adjusting the temperature of the support and thus of the object (or objects) supported thereon.

Alternatively thereto, the potential of the object can be adjusted independently of the arc current by an adjustable voltage source 39 to be at a value between the anode and cathode potentials in the space V. Both of these procedures are specifically suitable for a fine adjusting or feedback controlling of the temperature of the object. For adjusting the "heating current"—value I, the value of the resistance is adjusted about an operating point.

The temperature of the object may also be adjusted by adjusting the potential of the object, decoupled from the discharge.

For some processes it is also advantageous to bombard the growing coating with electrons. The open-loop controlling or feedback controlling of the applied flow of electrons proceeds in an analogous manner: The current I which flows off is a measure of the flow of electrons; it can be respectively influenced by resistance or by a direct shifting of the potential at the substrate.

In order to provide feedback control of the temperature, the temperature of the support 3 is measured and, such as is quite obvious to the person skilled in the art, an electrical signal which corresponds to the measured value is compared with a design or reference or rated value, and the resistance value of the resistance element 37 and/or the voltage value at the voltage source 39, acting as respective adjustment elements are adjusted in a feedback controlled manner.

By varying the reference value during the treatment process, the temperature of the object being treated can be made to follow a preset time characteristic in the sense of a master feedback control.

Departing from the arrangement according to FIG. 1 the following further development or embodiment steps can be derived:

in place of or in addition to the predetermined distribution of operating gas inlet, the generating of a predetermined distribution of the long low voltage arc discharge;

a considerable increase in the exploitation of the volume of the reaction space V by arranging objects to be treated on a plurality of distribution surfaces $E_2$.

It is not necessary to provide the drawing-off line 19 centrally, and it may also be located peripherally and/or in a distributed manner.

FIG. 2 illustrates, again based on a schematically illustrated inventive arrangement, a further inventive solution. In this arrangement, it is not the gas inlet which is designed in an aimed distributed manner, but rather the arc discharge.

Figure 2:
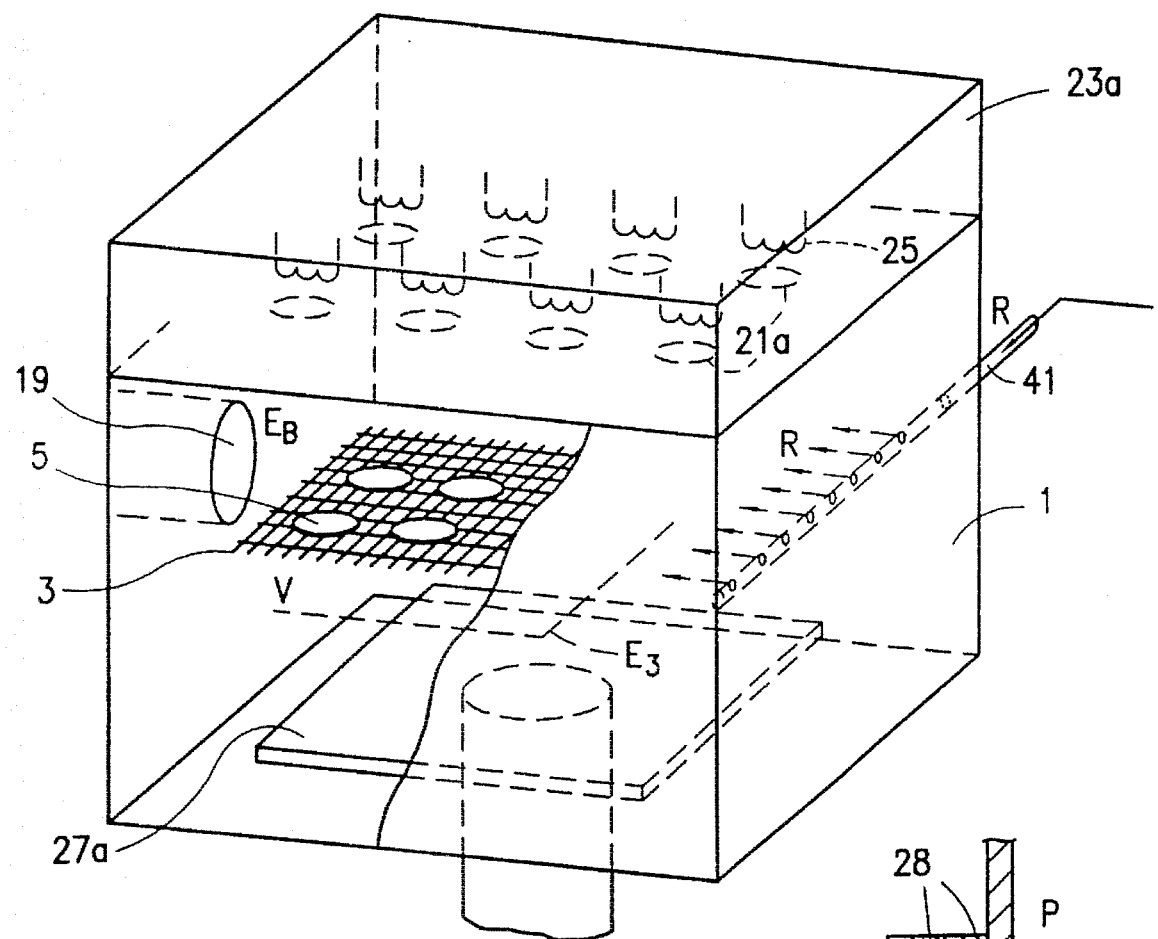
FIG. 2 illustrates schematically a second inventive arrangement and based thereupon, respectively a second inventive procedure.

Components illustrated in FIG. 2 which already have been described for the variant of the embodiment according to FIG. 1 are identified by the similar reference numerals.

A hot cathode chamber arrangement 23a is foreseen at a coating chamber 1 which is here designed in a cubic shape and to which the process gas R is fed via a supply line 41 which is perforated at its end such that the process gas R is in this case not areally distributed. The hot cathode chamber arrangement 23a extends along a wall of the parallelepiped wall of the chamber 1. One or a plurality of hot cathodes 25 are foreseen in this arrangement distributed in two dimensions, in an areal manner.

The cathode chamber arrangement 23a which obviously can also be formed by individual, separated chambers which are distributed accordingly, communicates via a plurality of orifice openings 21a with the reaction space V of the chamber 1. A rectangular-shaped or square-shaped, respectively anode 27a is located in chamber opposite the orifices 21a. A supporting screen 3 of the objects 5 to be coated is foreseen mutually to the direction of discharge. The draw-off line 19 is located at the side of the parallelepiped facing towards the process gas supply 41. The plurality of arc discharges which here are distributed in two dimensions, i.e. areally, lead along planes $E_B$ to a sufficiently uniform coating for a number of coating demands in spite of the not areally distributed in-feed of process gas. Also here the uniformity of the coating can be influenced by selected predetermined distribution of discharges. $E_3$ refers to planes along which the density of the plasma is substantially constant for equally distributed and equally operated anode/cathode arrangements.

By a selected areal or spatial distribution and/or selected controlling of respective single or groups of anode/cathode sets the spatial distribution of the plasma in the reaction space is influenced. Accordingly, it is possible that at the reactive treatment processes or chamber, respectively therefore, the spatial treatment distribution by means of the described long low voltage arc discharges can be set either by a desired large areal distribution of the process gas inlet and/or by a desired spatial distribution of the arc discharges, such that the objects to be coated and having large surfaces or simultaneously a large number thereof can be treated, with a desired distribution of the treatment, and this also three-dimensionally. The arc discharges can also be generated in a distributed manner by spark chambers in the fashion shown in connection with the illustration in FIG. 1b.

It may now be seen that the two inventive measures according to FIG. 1 and FIG. 2 are preferably combined in that the gas inlet is provided with a selected areal distribution, and also the arc discharges are provided with a selected spatial distribution. Hereinafter such a preferred arrangement will be described, whereby the person skilled in the art recognizes already when considering FIGS. 1 and 2 in a combined manner basically the combination of both procedures without any further ado.

It has been recognized that the mentioned, two-dimensionally uniform treating, for example, coating distribution achieved in accordance with FIG. 1 and FIG. 2 respectively proceeds into a three-dimensional uniform distribution if the anode/cathode direction and the direction of the gas consumption set predominantly by inlet and outlet are mutually equal or opposite.

Figure 3:
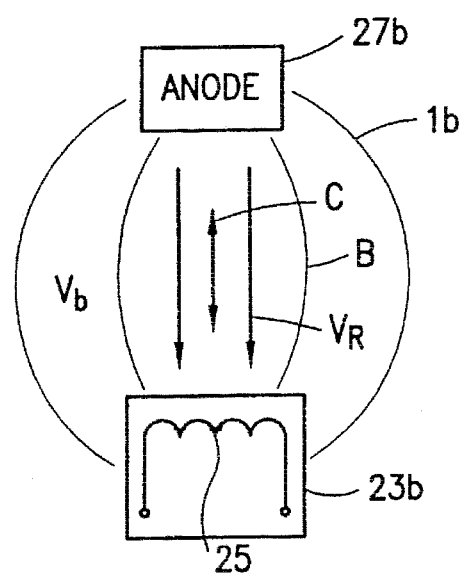
FIG. 3 illustrates an inventive combination of the procedures according to FIGS. 1 and 2, shown in schematic block illustration.

This procedure is illustrated in principle in FIG. 3, in which an arc discharge B extends between a hot cathode arrangement 23b and an anode arrangement 27b in a substantial volume area of a reaction space $V_b$ of a treatment chamber 1b in the same direction C as the direction $V_R$ of the consuming of the reaction gas set between the process gas inlet and the draw off. Such preferred embodiments shall now be disclosed which embodiments shall illustrate combining the procedures according to FIGS. 1, 2 and 3.

Figure 4:
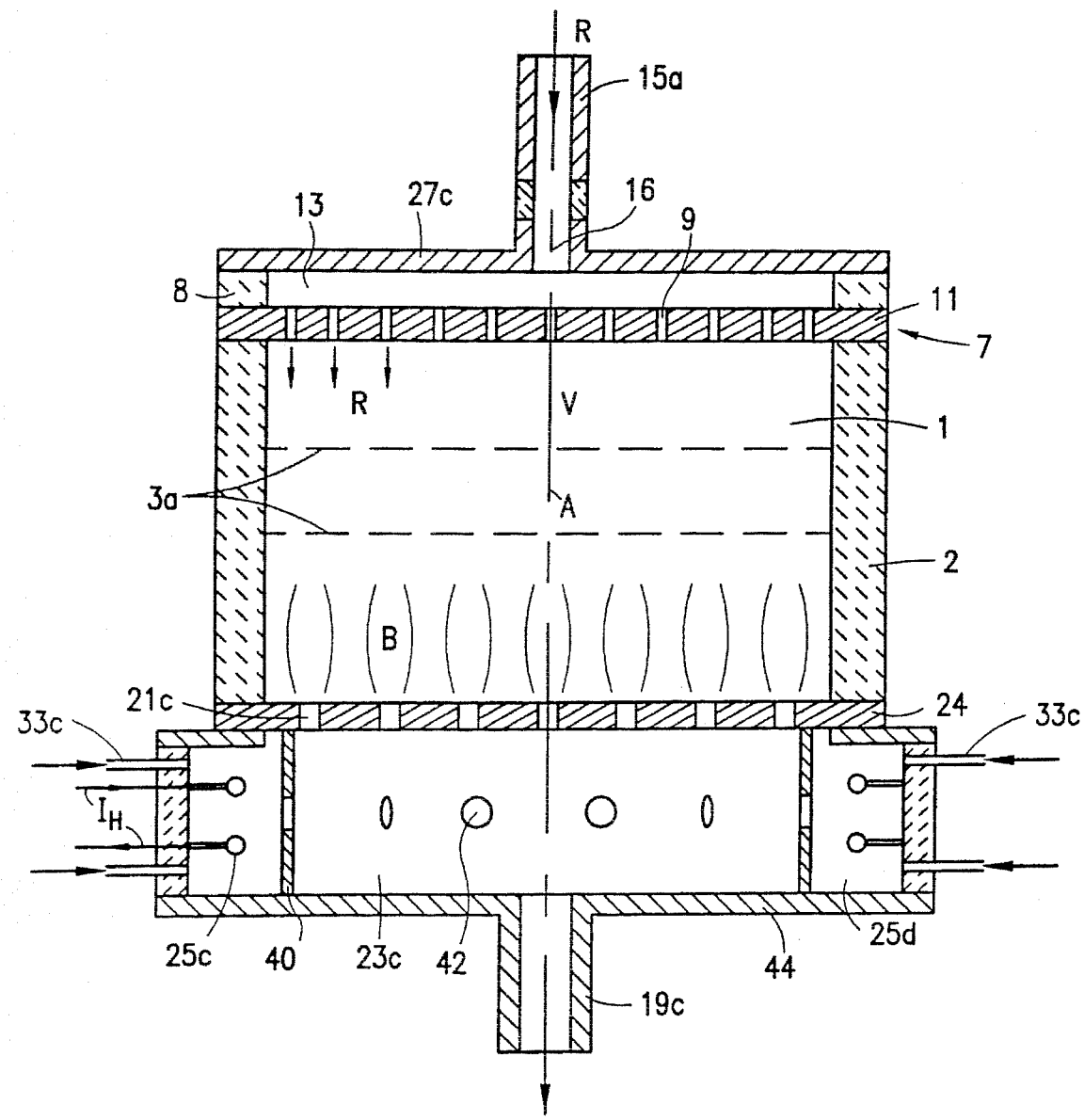
FIG. 4 illustrates schematically a longitudinal section through a preferred inventive arrangement, following the procedure according to FIG. 3.

The basic design of a first variant of such embodiments is illustrated schematically in FIG. 4. The chamber 1 includes a cylinder wall 2 formed of quartz. The reaction space V defined by the wall 2 is limited on the one hand by the inlet arrangement 7 with openings 9 for delivery of fresh process gas R. Upstream relative to the direction of outflow of fresh gas an anode plate 27c having an electrically insulated wall section 8, together with plate 11 forms the pressure distribution chamber 13, whereby the fresh process gas R is fed in through a line connection 15a having a central feed-in 16 through the anode plate 27c into the pressure distribution chamber 13. Anode plate 27c is preferably electrically insulated from connection 15a, as shown.

A plurality of object supports or substrate supporting screens 3a, respectively are arranged on planes extending substantially perpendicular to the longitudinal axis A of chamber 1. The reaction space V is closed off at the other side relative to the gas inlet arrangement by an orifice plate 24 having outlet orifices 21c for the schematically shown arc discharges B.

An annular-shaped hot cathode chamber 25d is foreseen adjacent the orifice plate 24 in which chamber 25d, for example, a directly heated hot cathode coil 25c extends for instance along the periphery thereof, coil 25c being directly heated by a heating current $I_H$. A low voltage generator (not shown for purposes of simplicity) is connected between the anode plate 27c and the hot cathode 25c. Scavenging gas lines 33c open into the area of the hot cathode 25c by means of which a scavenging gas such as argon or helium is fed into the area occupied by the hot cathode.

The gas fed in at the area of the hot cathode 25c protects the cathode from effects of the coating process. This leads to a substantial increase of the useful operating lifetime of the hot cathode.

In the illustrated embodiment the hot cathode 25c is surrounded by a coaxial orifice plate 40 having radially directed openings 42. By means of this a pressure gradient toward the center of the chamber 23c is possible.

At its one face the cathode chamber 23c is closed off by a cover part 44 having a central draw-off line 19c. The orifice plate 24 which is cooled (by means not illustrated), can however also consist of a high temperature resistant material such as tantalum or a high temperature resistant ceramic. The orifice screen or orifice plate 40 is preferably also made of such a material.

The plate 7 can possibly directly be used as the anode, namely, in such a case when the desired treatment process allows the plate 7 to be made of metal.

As already mentioned, the process gas R is fed through the inlet openings 9, preferably in a uniformly distributed manner into the reaction space V. The arc discharge is maintained out of the uniformly distributed orifice openings 21c and also via the openings 9 of the arrangement 7 by the anode 27c. At the same time gaseous reaction products flow through the orifice openings 21c in a counter current fashion relative to the electron flow of the arc discharge, and through the central area of the cathode chamber 23c out of the draw-off line 19c.

The workpieces or the objects are placed onto substrate supporting screens 3a operated, for example, at a floating potential or, in order to respectively regulate or control the temperature, connected via a current branch such as explained based on FIG. 1a to a reference potential or a control voltage source.

Figure 5:
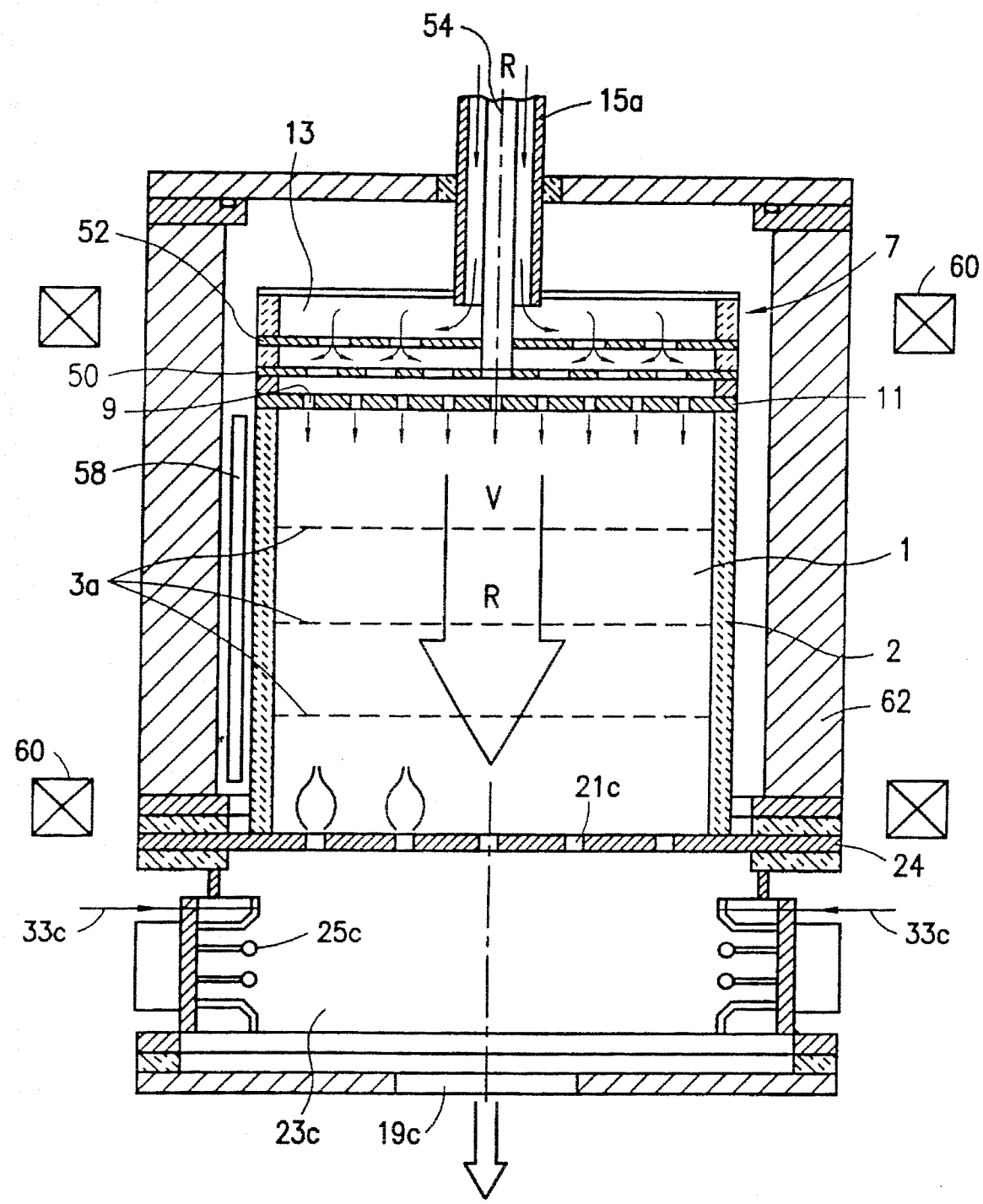
FIG. 5 illustrates in detail a variant of an embodiment in a longitudinal section according to FIG. 4 such as presently used.

FIG. 5 illustrates in a more detailed manner a presently preferred variant of an embodiment of an inventive treatment chamber. In the description thereof the same previously used reference numerals for the already described parts and structural units, respectively, are used.

The chamber 1 with the wall 2 is closed off at one end by the inlet arrangement 7. Behind the inlet plate 11 having inlet openings 9 for the process gas, which plate in this instance is made of quartz, a cooled anode plate 50 perforated by openings of relatively large diameters is located a spaced distance from the plate 11 and is electrically insulated as shown. A further perforated plate 52 which in turn is a spaced distance from the anode perforated plate 50 serves to provide an improved distribution of the gas. The electrical supply 54 for the anode is located along 30 the central axis of the central process gas supply tube 15a.

The pressure distribution chamber is formed here by two pressure stages between the two distribution plates 52 and 11. The anode plate 50 is designed to provide as little disturbance as possible, i.e., to be "transparent" for the process gas, on the one hand in order not to disturb the flow of the gas, and on the other hand to be detrimentally influenced by the gas as little as possible.

By means of this arrangement an optimal, homogeneous distribution of the gas is arrived at the here equally designed gas inlets 9 and in the same instance a cooling of the anode 50 is achieved.

Optionally, heating rods 58 may be provided outside of the chamber 1, or depending upon the needed power, also cooled screening plates.

Furthermore, magnet coils 60 may be provided outside of chamber 1 and coaxial to the anode/cathode set in order to optimize by means of d.c. or alternating magnet fields the distribution of the plasma in the reaction space V with the supports 3a.

The outer chamber with the optical heaters 58 is closed off by an outer wall 62.

Figure 6:
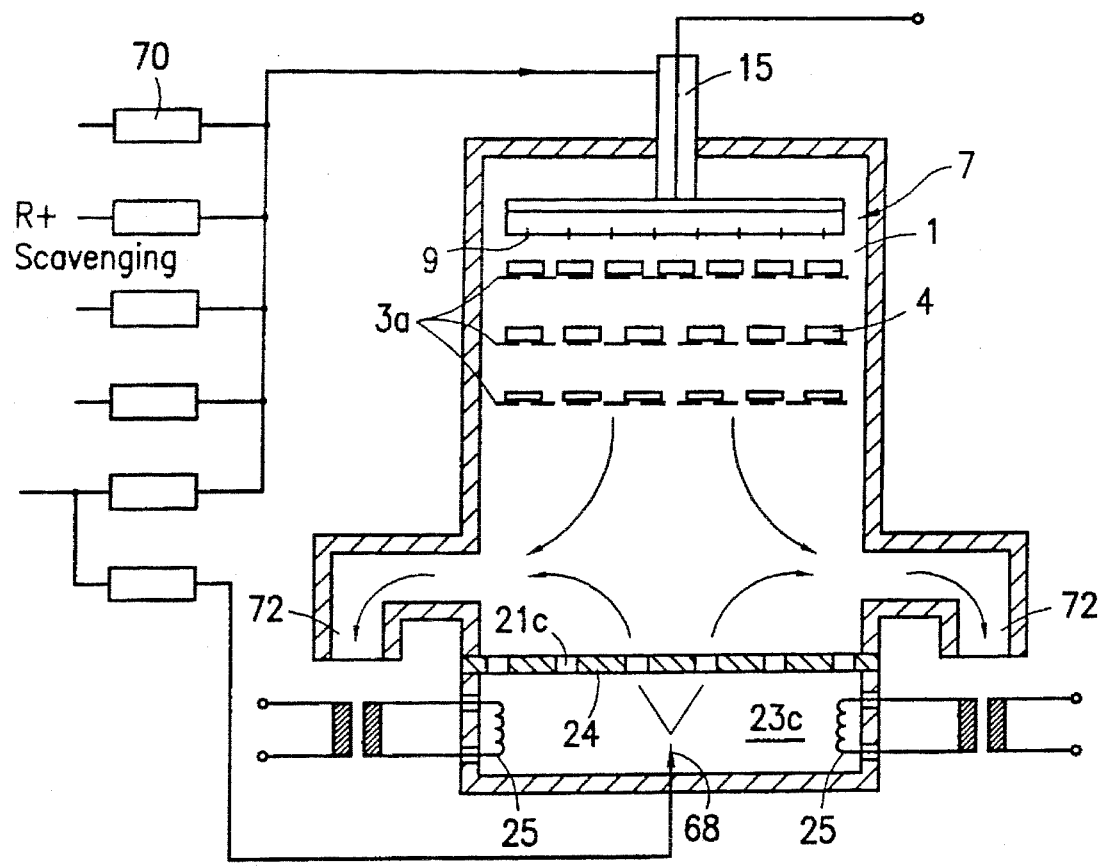
FIG. 6 illustrates a further variant of an embodiment of an inventive arrangement following the principle of FIG. 3 and in part corresponding to the embodiment according to FIGS. 4 and 5.

FIG. 6 illustrates schematically an inventive treatment chamber, in which the drawing off of the scavenging gas which is fed in through the schematically illustrated inlet 68, and also of the process gas which is fed as explained above, through the inlet 15 proceed peripherally. The above already used reference numerals are used again such that the arrangement illustrated here can be understood by the person skilled in the art without any further ado.

By a corresponding design of the openings respectively in the orifice and distribution plate 24 a pressure is set in the ionization or cathode chamber respectively which is larger than the pressure in the treatment space. By this means a specifically effective ionization of the gas is achieved. Because the gas in the ionization chamber 23 is substantially a noble gas, the useful lifetime of the cathode arrangement is increased significantly.

The objects to be treated are illustrated schematically and are located on carriers 3a. The reference numeral 70 identifies generally gas flow controllers on the one hand for the process gas R supplied via the connection 15, and on the other hand for scavenging gas supplied via the supply line 68.

The gas drawing off proceeds at the draw-off connections 72.

The following dimensions which are relatively critical values have proven themselves up to now positively:

density distribution $D_{21}$ of the opening 21c in the orifice plate 24: $D_{21} \geq 10/m^2$; preferably $D_{21} \geq 50/m^2$;

diameter $\Phi_{21}$ of the openings 21c in the orifice plate 24: 1 mm $\leq \Phi_{21} \leq$ 8 mm;

density $D_9$ of the openings 9 in the plate 7: $D_9 \geq 500/m^2$, preferably $D_9 \geq 2000/m^2$;

diameter $\Phi_9$ of the openings 9 in the distribution chamber 7: 0.5 mm $\leq \Phi_9 \leq$ 10 mm.

Figure 7:
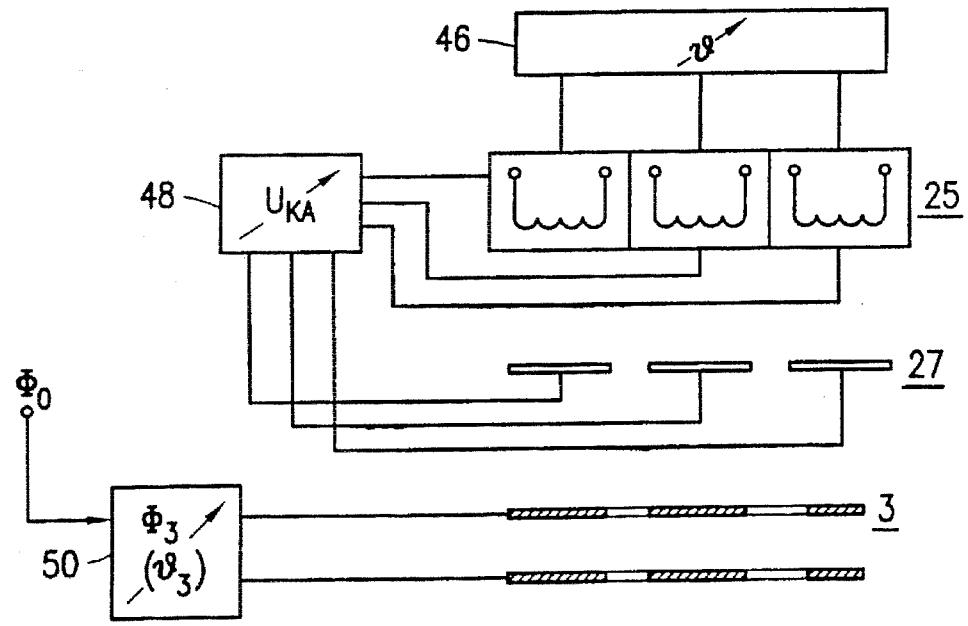
FIG. 7 illustrates schematically the electrically operated devices at an inventive arrangement and their inventive setting or control, respectively variants based on a function block diagram.

FIG. 7 illustrates schematically the electrically operated parts of the inventive arrangement. These include one, or as illustrated, more than one hot cathodes 25, one or more anodes 27 and one or more supports 3 for objects to be treated.

One or more of the following values may be adjusted for an optimizing of the treatment process:

In the case where more than one hot cathode 25 is provided, their operating temperatures, such as in the case of directly heated hot cathodes their heating current, may be, for example, selectively set for an optimizing of the distribution of the arc discharge. This is realized by an operation temperature control unit 46.

If more than one anode 27 and more than one hot cathode 25 are present and in an analogous manner, if one hot cathode and more than one anode or one anode and more than one hot cathode, respectively are provided, the respective low voltage values of the anode/cathode voltages $U_{KA}$ may be set selectively at a control unit 48 for optimizing the arc discharge distribution.

The electrical operating potentials of the supports 3 which in this case consist at least of sections of a conductive material, are at least influenced at a selective adjusting unit 50, this may be by means of voltage sources 39 according to FIG. 1a and/or adjusting of the value of the resistance in a current branch 35 according to FIG. 1a, specifically for a fine adjustment of the temperature of the object being treated or of the electron bombardment of a growing coating, respectively.

The illustrated coating arrangement for reactive, low voltage arc plasma enhanced treatments operate at low anode/cathode voltages, for instance below 150 V, and can be operated with high discharge currents per commodity support surface area, for instance more than 4000 A/m² and lead to low treatment temperatures, substantially below 900° C. The high plasma densities at low treatment temperatures reached lead to a plurality of applications.

Although the disclosed method and the apparatus therefore are basically suitable for reactive, arc plasma enhanced treatment methods, they are specifically suitable for such coating methods.

While there are shown and described present preferred embodiments of the invention, it is distinctly understood that the invention is not limited thereto, but may be otherwise variously embodied and practiced within the scope of the following claims and separate portions may be used separately.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein described.

What is claimed is:

1. A method for vacuum process treatment of at least a surface portion of a workpiece, comprising the steps of:
   (a) generating a DC plasma discharge by applying a DC voltage between an anode arrangement and a cathode arrangement in a vacuum chamber to produce an electric field in a discharge space between said anode arrangement and said cathode arrangement;
   (b) feeding electrically charged particles into said discharge space;
   (c) continuously introducing fresh reactive gas into said discharge space;
   (d) continuously removing gases and gaseous reaction products from said discharge space;
   (e) controlling flow direction of said fresh reactive gas introduced during step (c) so that said flow direction is substantially parallel to an imaginary line representing a DC arc discharge space and extending between said anode arrangement and said cathode arrangement and where the reactive gas is introduced in a region adjacent to one of the cathode and anode arrangements and is removed in a region adjacent to another one of the anode and cathode arrangements to thereby control the flow direction; and
   (f) positioning said workpiece to expose a workpiece surface portion to said plasma discharge and said fresh reactive gas.

2. The method of claim 1, wherein step (b) further comprises generating said electrically charged particles by thermo-electron emission.

3. A method for vacuum process treatment of at least a surface portion of a workpiece, comprising the steps of:
   (a) generating a DC plasma discharge;
   (b) applying a DC voltage between an anode arrangement and a cathode arrangement in a vacuum chamber to produce an electric field in a discharge space between said anode arrangement and said cathode arrangement;
   (c) feeding electrically charged particles into said discharge space;
   (d) introducing a process gas into said discharge space;
   (e) removing gases and gaseous reaction products from said discharge space;
   (f) controlling flow direction of said gas introduced during step (d) so that said flow direction is substantially parallel to an imaginary line representing a DC arc discharge space and extending between said anode and said cathode;
   (g) positioning said workpiece to expose a workpiece surface portion to said plasma discharge and said process gas and said cathode arrangement including a plurality of cathodes, and step (c) further comprising generating said electrically charged particles by thermo-electron emission at least one cathode of said cathode arrangement.

4. A method for vacuum process treatment of at least a surface portion of a workpiece, comprising the steps of:
   (a) generating a DC plasma discharge;
   (b) applying a DC voltage between an anode arrangement and a cathode arrangement in a vacuum chamber to produce an electric field in a discharge space between said anode arrangement and said cathode arrangement;
   (c) feeding electrically charged particles into said discharge space;
   (d) introducing a process gas into said discharge space;
   (e) removing gases and gaseous reaction products from said discharge space;
   (f) controlling flow direction of said gas introduced during step(d) so that said flow direction is substantially parallel to an imaginary line representing a DC arc discharge space and extending between said anode and said cathode;
   (g) positioning said workpiece to expose a workpiece surface portion to said plasma discharge and said process gas and step (d) further comprising introducing said fresh gas into said discharge space through a plurality of openings spatially distributed along a wall portion bordering said discharge space.

5. A method for vacuum process treatment of at least a surface portion of a workpiece, comprising the steps of:
   (a) generating a DC plasma discharge;
   (b) applying a DC voltage between an anode arrangement and a cathode arrangement in a vacuum chamber to produce an electric field in a discharge space between said anode arrangement and said cathode arrangement;
   (c) feeding electrically charged particles into said discharge space;
   (d) introducing a process gas into said discharge space;
   (e) removing gases and gaseous reaction products from said discharge space;
   (f) controlling flow direction of said gas introduced during step (d) so that said flow direction is substantially parallel to an imaginary line representing a DC arc discharge space and extending between said anode and said cathode;
   (g) positioning said workpiece to expose a workpiece surface portion to said plasma discharge and said process gas and step (d) further comprising introducing said gas through a plurality of spatially arranged inlet openings and providing a distribution of introduced gas by at least one of: selectively controlling cross-sectional areas of said openings; selectively controlling an axial extent of said openings; selectively controlling gas pressure of gas delivered to said openings; and selectively controlling a direction of introducing said gas through said openings relative to a direction of said electric field.

6. The method of claim 1, further comprising placing at least two workpieces in said discharge space and arranging said workpieces so that they are staggered in a direction of said electric field.

7. A method for vacuum process treatment of at least a surface portion of a workpiece, comprising the steps of:
   (a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and step (c) further comprising generating said electrically charged particles by thermo-electric emission by providing a thermo-electric emitter and shielding said thermoelectric emitter from the gas introduced by step (d) by flowing a shielding gas over said thermo-electric emitter.

8. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field is a discharge pace between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and step (c) further comprising feeding said electrically charged particles through a plurality of openings and in a direction towards one of said cathode arrangement and of said anode arrangement.

9. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and step (e) further comprising removing said gas through a multitude of outlet openings distributed along a wall portion bordering said discharge space.

10. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and step (d) further comprising introducing said fresh gas through a multitude of openings in one of a plurality of cathodes of said cathode arrangement and in one of a plurality of anodes of said anode arrangement.

11. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction Of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and step (e) further comprising removing said gas from the discharge space through a multitude of openings in one of a plurality of cathodes of said cathode arrangement and one of a plurality of anodes of said anode arrangement.

12. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line presenting a DC arc discharge space and extending between said anode and said cathode;

(g) positioning said workpiece to expose a workpiece surface portion to said plasma discharge and said process gas and at least one of said cathode arrangement and of said anode arrangement being separated from said discharge space by a wall having a plurality of spatially distributed openings, and step (d) further comprises introducing said fresh gas through said openings.

13. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and at least one of said cathode arrangement and of said anode arrangement being separated from said discharge space by a wall having a plurality of spatially distributed openings, and step (e) further comprises removing said gas from said discharge space.

14. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and further comprising the step of maintaining said workpiece in said discharge space at floating electrical potential.

15. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement;

(c) feeding electrically charged particles into said discharge space;

(d) introducing a process gas into said discharge space;

(e) removing gases and gaseous reaction products from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and further comprising the step of connecting said workpiece to an electric reference potential via resistive means.

16. The method of claim 15, further comprising the step of adjusting said resistive means to control a temperature of said workpiece.

17. A method for vacuum process treatment of at least a surface portion of a workpiece, comprising the steps of:

(a) generating a DC plasma discharge;

(b) applying a DC voltage between an anode arrangement and a cathode arrangement in a vacuum chamber to produce an electric field in a discharge space between said anode arrangement and said cathode arrangement:

(c) feeding electrically charged particles into said discharge space;

(d) introducing process gas into said discharge space;

(e) removing gases and gaseous reaction product from said discharge space;

(f) controlling flow direction of said gas introduced during step (d) so that said flow direction is substantially parallel to an imaginary line representing a DC arc discharge space and extending between said anode and said cathode;

(g) positioning said workpiece to expose a workpiece surface portion to said plasma discharge and said process gas and further comprising the step of maintaining a workpiece arranged in said discharge space at an adjustable electric potential.

18. The method of claim 4, further comprising controlling said process gas introduced through said openings to flow uniformly through said inlets.

19. A method for vacuum process treatment of at least a surface portion of a workpiece, comprising the steps of:

(a) generating a DC plasma discharge;

(b) apply a DC voltage between an anode arrangement and a cathode arrangement to produce an electric field in a discharge space between said cathode arrangement and said anode arrangement;

(c) feeding electrically charged particles into said discharge space defined between said anode arrangement and said cathode arrangement;

(d) introducing fresh gas into said discharge space;

(e) removing gases and gaseous reaction products from said discharge space;

(f) providing at least one of said cathode arrangement and of said anode arrangement with a distributed arrangement of separate cathode electrodes or anode electrodes respectively to obtain a spatially distributed DC plasma discharge; and (g) arranging said workpiece within said spatially distributed plasma discharge.

* * * * *